(12) United States Patent
Gotou

(10) Patent No.: US 9,123,013 B2
(45) Date of Patent: Sep. 1, 2015

(54) CONTAINER CONVEYING CARRIAGE AND CONVEYING SYSTEM INCLUDING A CONTAINER CONVEYING CARRIAGE

(71) Applicant: Daifuku Co., Ltd., Osaka (JP)

(72) Inventor: Yukihiro Gotou, Komaki (JP)

(73) Assignee: DAIFUKU CO., LTD., Osaka (JP)

( * ) Notice: Subject to any disclaimer, the term of this patent is extended or adjusted under 35 U.S.C. 154(b) by 0 days.

(21) Appl. No.: 14/267,780

(22) Filed: May 1, 2014

(65) Prior Publication Data
US 2014/0353117 A1    Dec. 4, 2014

(30) Foreign Application Priority Data
May 29, 2013    (JP) .................................. 2013-113237

(51) Int. Cl.
*B65G 43/00*    (2006.01)
*G06Q 10/08*    (2012.01)
*H01L 21/677*    (2006.01)

(52) U.S. Cl.
CPC ............ *G06Q 10/08* (2013.01); *H01L 21/6773* (2013.01); *H01L 21/67706* (2013.01); *H01L 21/67736* (2013.01)

(58) Field of Classification Search
CPC .... B65G 43/08; B65G 43/10; B65H 2220/02; B65H 2220/01; G06Q 10/087; G06Q 10/0875

USPC ............. 198/358, 349, 347.1, 349.6; 700/216
See application file for complete search history.

(56) References Cited

U.S. PATENT DOCUMENTS

| | | | | |
|---|---|---|---|---|
| 5,351,801 | A * | 10/1994 | Markin et al. | 198/346.1 |
| 6,654,663 | B1 * | 11/2003 | Jokela | 700/230 |
| 2008/0183327 | A1 * | 7/2008 | Danelski | 700/216 |
| 2011/0073534 | A1 * | 3/2011 | Linge et al. | 209/705 |
| 2014/0244026 | A1 * | 8/2014 | Neiser, Raymond R. | 700/216 |

FOREIGN PATENT DOCUMENTS

JP    05-023931 A    2/1993

* cited by examiner

*Primary Examiner* — James R Bidwell
(74) *Attorney, Agent, or Firm* — McGinn IP Law Group, PLLC

(57) ABSTRACT

A container conveying carriage includes a supporting section which supports a container, a container transfer device which transfers the container, and an item supply device which supplies an item stored in the container. The carriage can travel along a traveling path. Also, the container transfer device transfers the container between the supporting section and a container transfer point outside the carriage. Moreover, the item supply device takes out the item from the container and supplies the item to an item supply point outside the carriage.

7 Claims, 9 Drawing Sheets

Fig. 3

| CONTAINER ID | SLOT No. | | | | | | | | | | | | | | | | | | | |
|---|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 | 19 | 20 |
| 101001 | a | b | a | a | a | a | a | b | a | b | a | a | a | a | a | c | a | b | b | a |
| 101002 | a | a | a | c | a | a | a | a | a | a | c | a | a | a | a | b | a | a | n | a |
| 101003 | a | a | c | a | a | a | c | a | a | b | a | a | n | a | a | b | a | c | a | a |
| 101004 | b | a | b | a | a | n | a | a | c | a | a | a | a | a | a | c | a | a | a | a |
| ... | | | | | | | | | | | | | | | | | | | | |
| 101010 | a | c | a | a | a | b | a | a | b | a | n | c | a | a | b | a | a | a | c | b |
| ... | | | | | | | | | | | | | | | | | | | | |

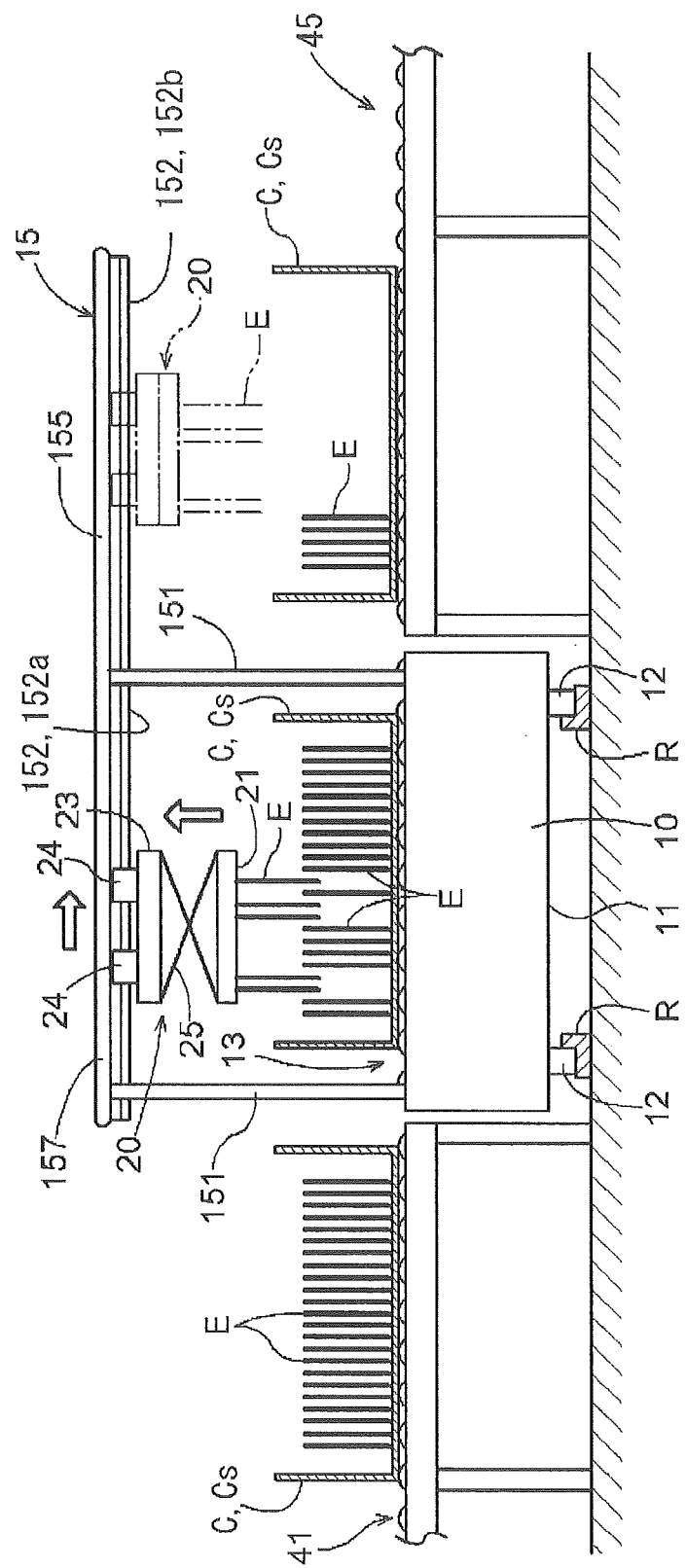

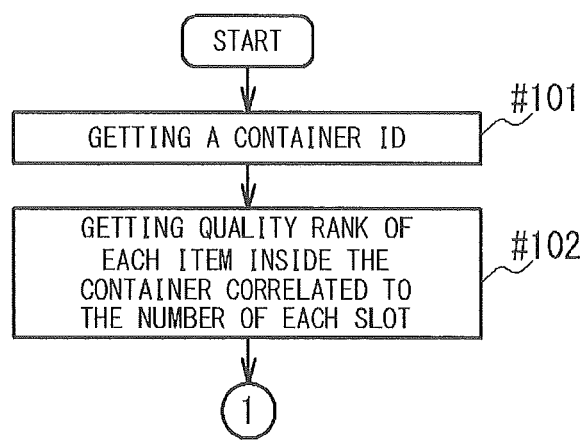

CONTAINER CONVEYING CARRIAGE AND CONVEYING SYSTEM INCLUDING A CONTAINER CONVEYING CARRIAGE

CROSS REFERENCE

This application is based upon and claims the benefit of priority from Japanese patent application No. 2013-113237, filed on May 29, 2013, the disclosure of which is incorporated herein by reference.

TECHNICAL FIELD

The present invention relates to a container conveying carriage and a conveying system that includes a container conveying carriage.

BACKGROUND ART

A technique in which a conveying carriage conveys a container is known (for example, refer to a patent literature 1). A container conveying carriage in the patent literature 1 is used to receive the container as a conveying object from a conveying source and convey and transfer the container to a temporal placing table. An item, which is stored in the container placed on the temporal placing table, is taken out by using a robot and supplied to an item supply point.

CITATION LIST

Patent Literature

[Patent Literature 1] JP H05-023931A

SUMMARY OF THE INVENTION

The present invention provides a container conveying carriage. The container conveying carriage includes a supporting section disposed to support a container, a container transfer device disposed to transfer the container, and an item supply device disposed to supply an item stored in the container. The carriage can travel along a traveling path. Also, the container transfer device transfers the container between the supporting section and a container transfer point outside the carriage. Moreover, the item supply device takes out the item from the container and supplies the item to an item supply point outside the carriage.

Since the container conveying carriage includes the container transfer device and the item supply device, an efficiency of a supplying work of the item is improved.

BRIEF DESCRIPTION OF THE DRAWINGS

FIG. 3 is a table schematically showing information managed by a control unit in the first embodiment of the present invention;

FIG. 7 is a diagram showing an operation of the item supply device in the first embodiment of the present invention; and FIG. 8A is a flowchart (first portion) showing a control of the container conveying carriage in the first embodiment of the present invention.

DESCRIPTION OF EMBODIMENTS

At first, terms are defined. An article stored in a container is defined as "an item E". The container that stores the item E is defined as "a container C". Also, when it should be emphasized that the container includes the item E, the container is represented as "a container Cs". Moreover, when it should be emphasized that the container does not include the item E, the container is represented as "a container Ck".

With reference to the drawings, a conveying system 1 including a container conveying carriage in a first embodiment of the present invention will be described below.

(Outline of Conveying System 1)

Figure 1:
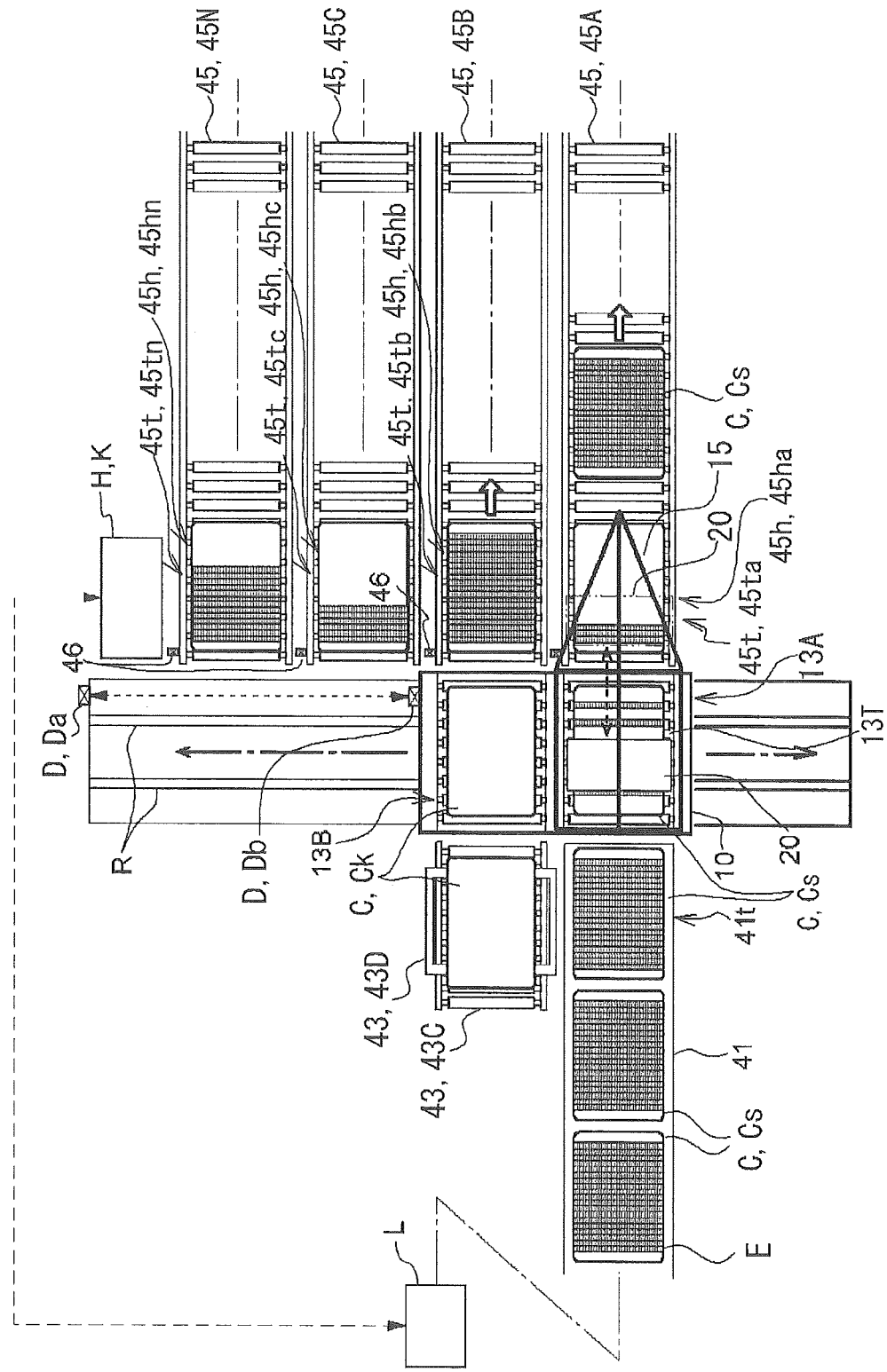
FIG. 1 is a schematic plan view of a conveying system according to a first embodiment of the present invention.

With reference to FIG. 1, a conveying system 1 according to the first embodiment of the present invention will be schematically described below. Note that the detail will be described later. FIG. 1 is a schematic plan view of the conveying system according to the first embodiment of the present invention.

(Outline of Configuration of Conveying System)

The conveying system 1 includes (a) a traveling path (rail R), (b) a container conveying carriage 10 that travels along the traveling path, (c) a plurality of container transfer points 41$t$, 45$ta$, 45$tb$, 45$tc$ and 45$tn$, and (d) one or more item supply points 45$ha$, 45$hb$, 45$hc$ and 45$hn$. The conveying system 1 may include (e) an inspection device L. Also, the conveying system 1 may include (f) an empty container supply device 43. Also, the conveying system 1 may include (g) a control unit H. Moreover, the control unit H may be arranged in the container conveying carriage 10 or may be arranged outside the container conveying carriage 10 (in FIG. 1, the control unit H is arranged outside the container conveying carriage 10). The conveying system 1 may include other devices. Also, the container transfer point 41$t$ may be a container placement region of a downstream end of a container supply conveyer 41. Moreover, the container transfer points 45$ta$, 45$tb$, 45$tc$ and 45$tn$ may be container placement regions in upstream ends of sorting conveyers 45A, 45B, 45C and 45N, respectively.

In the conveying system 1, the container transfer points 41$t$, 45$ta$, 45$tb$, 45$tc$ and 45$tn$ are set outside the carriage 10. Preferably, the container transfer points 41$t$, 45$ta$, 45$tb$, 45$tc$ and 45$tn$ are set adjacently to the traveling path (rail R). Here, the word "adjacent" indicates that it is located in a distance or a region where a container can be transferred by a container transfer device 13A to be described later. Also, in the conveying system 1, the item supply points 45$ha$, 45$hb$, 45$hc$ and 45$hn$ are set outside the carriage 10. Preferably, the item supply points 45$ha$, 45$hb$, 45$hc$ and 45$hn$ are set adjacently to the traveling path (rail R). Here, the word "adjacent" indicates that it is located in a distance or a region where an item can be supplied by an item supply device 20 to be described later.

It should be noted that when any one among the container transfer points 45$ta$, 45$tb$, 45$tc$ and 45$tn$ is pointed out, the pointed out container transfer point is represented as "a container transfer point 45$t$". Also, when any one among the item supply points 45$ha$, 45$hb$, 45$hc$ and 45$hn$ is pointed out, the pointed out item supply point is represented as "an item supply point 45*h*". Also, when any one among the sorting conveyers 45A, 45B, 45C and 45N is pointed out, the pointed out sorting conveyer is represented as "a sorting conveyer 45".

(Outline of Operation of Conveying System 1)

The conveying system 1 operates in response to an instruction of the control unit H, as followings. Firstly, a container Cs that stores one or plurality of items E is placed at the container transfer point 41*t*. Secondly, the container conveying carriage 10 travels along the traveling path (rail R) and stops at a position corresponding to the container transfer point 41*t*. Thirdly, the container conveying carriage 10 receives the container Cs placed at the container transfer point 41*t*. Then, the container Cs is supported by a container supporting section 13T (hereafter, to be referred to as "the supporting section 13T") on the carriage 10. An operation for receiving the container Cs is carried out by a container transfer device 13A arranged in the carriage 10. Fourthly, the carriage 10 travels along the traveling path and stops at a position corresponding to the container transfer point 45*t*. Fifthly, the carriage 10 executes transfer of the container Cs, or supply of the item E. The transfer of the container Cs indicates that the container Cs supported by the supporting section 13T is transferred to the container transfer point 45*t*. The transfer of the container Cs is carried out by the container transfer device 13A. The supply of the items E indicates that from the container Cs supported by the supporting section 13T, one or a plurality of items E are taken out and supplied to the item supply point 45*h*. The supply of the items E is carried out by the item supply device 20 arranged in the carriage 10.

In the conveying system 1, the item(s) E can be directly supplied to the item supply point 45*h* from the container Cs on the carriage 10. For this reason, a working efficiency is improved as compared with a case where the item(s) E are supplied from the container Cs to the item E supply point 45*h* after the container Cs is unloaded from the carriage 10. Also, since the item supply device 20 is arranged in the container conveying carriage 10, one item supply device 20 can be used to supply the item(s) to the plurality of item supply points 45*ha*, 45*hb*, 45*hc* and 45*hn*, respectively.

(Detail of Conveying System 1)

With reference to FIGS. 1 to 8, the conveying system 1 according, to the first embodiment of the present invention will be described in detail.

Figure 2:
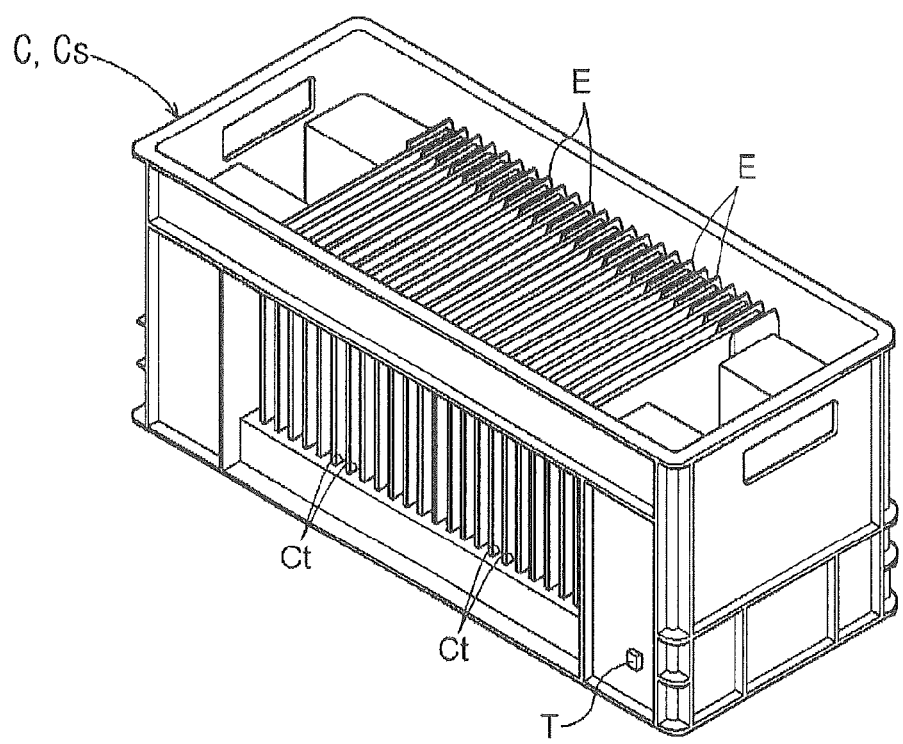
FIG. 2 is a perspective view of a container in the first embodiment of the present invention.

As shown in FIG. 1, in this embodiment, the container conveying carriage 10 is arranged in the conveying system 1. The conveying system 1 is, for example, a sorting facility 1 for sorting each of the plurality of items E for each quality rank. An example of the item E is a secondary battery. The secondary battery is moved into the conveying system 1 after the processing steps such as charging and aging. At the processing steps, as shown in FIG. 2, the plurality of items E (the secondary batteries) are stored in the container C. Then, at the processing steps, each processing step is carried out in units of the container C, and a conveying operation between one processing step and another processing step is carried out in units of the container C, or a storing operation in a warehouse and the like is carried out in units of the container C.

(Container)

With reference to FIG. 2, the container used in this embodiment will be described below. FIG. 2 is a perspective view of the container in the first embodiment of the present invention.

In the container C, the top portion is opened. An identification tag T (hereafter, to be referred to as "an ID tag T") for identifying the container C is attached to the container C. The ID tag T is RFID, a bar code or the like. Also, a plurality of accommodators (for example, slots Ct) are arranged in the container C to store the items E. The item E is inserted through the opening of the container C into the slot Ct, or taken out from the slot Ct. The number of the slots Ct arranged in the container C is, for example, 20. Note that a shape of the container C, positions and number of the openings of the container C, shapes and number of the accommodators of the container C, the kind of the item E, an attachment position of the ID tag T and the like are optional.

An example of a case in which the item E is the secondary battery E (cell E) will be described. Each of the cells E has a shape of a rectangular plate. The rectangular plate has a first plane and a second plane that are wide in area. The cell E has two electrode tags. The first electrode tag is arranged on one side of an outer circumference of the first plane. Also, the second electrode tag is arranged on one side of an outer circumference of the second plane. The first electrode tag and the second electrode tag are separated from each other and arranged to oppose to each other. A plurality of the cells E are respectively held in the plurality of the slots Ct of the container C in a situation in which the cells E are separated from each other.

(Inspection Device L)

As shown in FIG. 1, the inspection device L is arranged on the upstream side of the conveying system 1 to inspect each of the plurality of items E stored in the container C. The inspection device L uses a tag reader (not shown) to read the ID tag T of the container C and acquires ID information of the container C. The inspection device L specifies a position (for example a slot number) of the slot Ct that stores the item E of an inspection target. Also, the inspection device L inspects the quality of the item E that exists at the specified position. The inspection device L assigns quality rank information to the item E on the basis of an inspection result. The rank information is data of the item (cell E) that is determined on the basis of, for example, an open circuit voltage, a temperature increase when the battery is charged, and the like. The inspection device L assigns a rank a, a rank b or a rank c to the item E of the inspection target in an order from the highest quality. Also, a rank n is assigned as an NG item to a defective item. The inspection device L transmits the ID information of the container, accommodation position information of the item and the rank information of the item to the control unit H via wired communication or wireless communication.

The rank information assigned by the inspection device L is managed by a data manager K that is included in the control unit H to be described later. The data manager K includes a database. The database relates and stores the ID information of the container, the accommodation position information of the item and the rank information of the item, as shown on a table in FIG. 3.

Note that even if the items E are manufactured under the same condition, individual differences are generated between their qualities. For this reason, the same rank is not always assigned to all of the items E stored in a certain container Cs. However, when the items E are shipped, or when a treatment is performed on the item E determined as a defective item, the sorting operation is required to be performed for each group of items E to which the same rank is assigned. The conveying system 1 (sorting facility 1) in this embodiment can be used to sort the items E for each group of items E to which the same rank is assigned.

(Container Supply Conveyer 41)

As shown in FIG. 1, the conveying system 1 includes the container supply conveyer 41. The conveyer 41 is a conveyer that supplies the container Cs. Here, the container Cs stores the items E to which the rank assignment has been completed. The conveyer 41 conveys the container Cs to the container transfer point 41*t*. The conveyer 41 includes a plurality of conveyance rollers along a convey direction and can continuously convey the containers Cs. The conveying direction of the conveyer 41 is, for example, the direction orthogonal to the traveling direction of the carriage 10.

(Empty Container Supply Device 43)

As shown in FIG. 1, the conveying system 1 includes an empty container supply device 43. The empty container supply device 43 includes a destacking device 43D and an empty container supply conveyer 43C. The destacking device 43D destacks empty containers Ck stacked in a stacked state. The empty container supply conveyer 43C conveys the containers Ck destacked. The conveying direction of the conveyer 43C is, for example, a direction orthogonal to the traveling direction of the carriage 10 and the direction toward the rail R.

(Sorting Conveyer 45)

As shown in FIG. 1, the conveying system 1 includes the plurality of the sorting conveyers 45A, 45B, 45C and 45N. The containers C for storing the sorted items E are placed at the container transfer points 45*ta*, 45*tb*, 45*tc* and 45*tn* of the sorting conveyers. Note that preferably, a holding device (not shown) for positioning and holding the placed container C is arranged at each of the container transfer points 45*ta*, 45*tb*, 45*tc* and 45*tn*. The sorting conveyer 45 conveys the container C placed at the container transfer point 45*t* toward the downstream side of the sorting conveyer 45.

(Rail R)

As shown in FIG. 1, the conveying system 1 includes the rail R. The rail R is arranged along the container transfer point 41 (the container placement region on the downstream side of the container supply conveyer 41), the plurality of container transfer points 45*ta*, 45*tb*, 45*tc* and 45*tn* (the container placement region on the upstream side of the sorting conveyers 45A, 45B, 45C and 45N) and the empty container supply device 43.

(Container Conveying Carriage 10)

Figure 4:
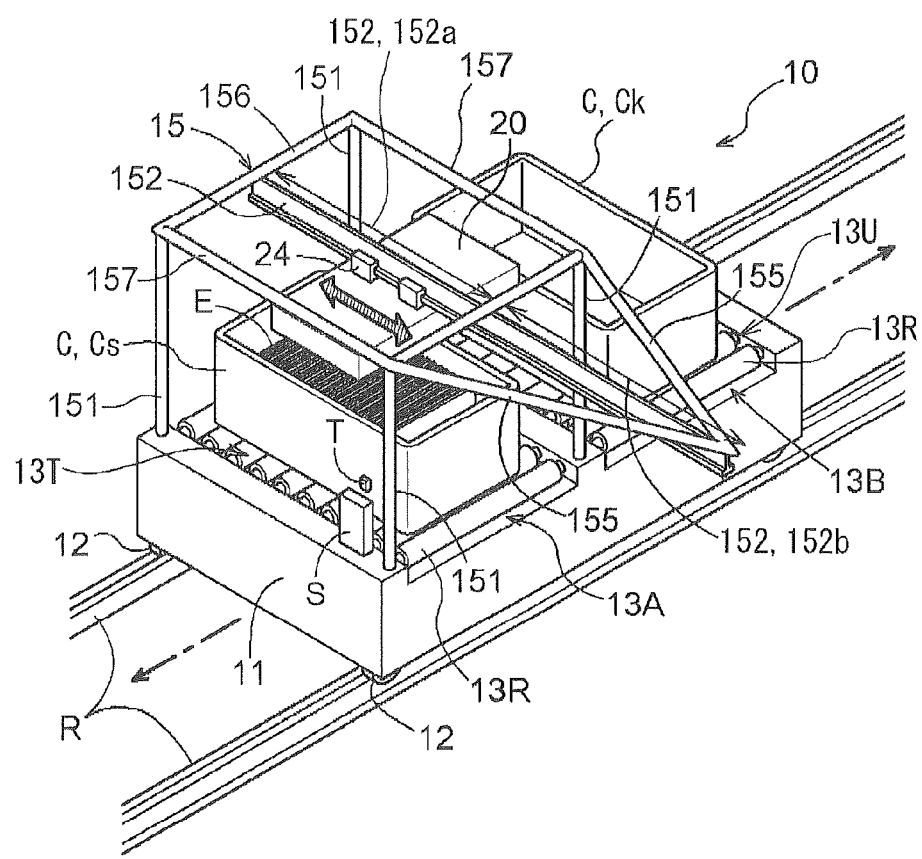
FIG. 4 is a perspective view of a container conveying carriage in the first embodiment of the present invention.

As shown in FIG. 1, the conveying system 1 includes the container conveying carriage 10. The carriage 10 travels on the rail R. As shown in FIG. 4, the carriage 10 includes a traveling section 11, the supporting section 13T (container supporting section 13T), the container transfer device 13A and the item supply device 20. The carriage 10 may include an empty container transfer device 13B and an empty container supporting section 13U. Also, the carriage 10 may include an ID tag reader S. Moreover, as shown in FIG. 1, the carriage 10 may include a traveling position detector Db(D) to acquire position information of the carriage 10. The traveling position detector Db(D) is, for example, a reflection plate. A distance is measured between the reflection plate and a traveling position detector Da(D) (for example, a laser type distance sensor) arranged at the vicinity of the rail R. The measured distance is transmitted as position information of the carriage 10 to the control unit H.

With reference to FIG. 4, the container conveying carriage will be described below in detail.

(Container Conveying Carriage: Traveling Section 11)

The container conveying carriage 10 includes the traveling section 11. The traveling section 11 includes running wheels 12. The running wheels 12 run on the rail R. The running wheels 12 are driven by a running driver 16 (FIG. 6) to be described later.

(Container Conveying Carriage: Container Transfer Device 13A)

The container transfer device 13A is arranged above the traveling section 11 and can convey the container C in the direction orthogonal to the traveling direction of the carriage 10. The transfer device 13A receives the container Cs from the container supply conveyer 41 (the container transfer point 41*t*). The received container Cs is supported by the supporting section 13T of the carriage 10. Preferably, a holding device (not shown) is arranged in the carriage 10 to position and hold the container Cs supported by the supporting section 13T. Also, the transfer device 13A transfers the container Cs supported by the supporting section 13T to the sorting conveyer 45. The transfer to the sorting conveyer 45 is carried out in a situation that the carriage 10 (the transfer device 13A) stops at a stop position (a stop position for container transfer) corresponding to the sorting conveyer 45. Moreover, the ID tag reader S is arranged on the carriage 10. The ID tag reader S is arranged at a position where the ID tag T of the container Cs can be read when the container Cs is supported by the supporting section 13T. The transfer device 13A is, for example, a roller conveyer. Also, the supporting section 13T is, for example, a plurality of rollers 13R of the roller conveyer. Alternatively, the transfer device 13A may be a slide folk that can place or hold the container Cs. Also, the supporting section 13T may be a support plate that is arranged instead of the rollers 13R.

(Container Conveying Carriage: Empty Container Transfer Device 13B)

The empty container transfer device 13B that can convey the empty container Ck in the direction orthogonal to the traveling direction of the carriage 10 is arranged above the traveling section 11. The empty container transfer device 13B and the container transfer device 13A are arranged adjacent to each other along the traveling direction of the carriage 10. The empty container transfer device 13B receives an empty container Ck from the empty container supply device 43. The received empty container Ck is supported by the supporting section 13U of the carriage 10. Preferably, a holding device (not shown) for positioning and holding the container Ck supported by the supporting section 13U is arranged in the carriage 10. Also, the empty container transfer device 13B transfers the container Ck supported by the supporting section 13U to the sorting conveyer 45. The transfer to the sorting conveyer 45 is carried out in a situation that the carriage 10 (the transfer device 13B) stops at a stop position (a stop position for empty container transfer) corresponding to the sorting conveyer 45. Moreover, apart from the ID tag reader S, an ID tag reader (not shown) is arranged on the carriage 10. The ID tag reader is arranged at a position where the ID tag T of the container Ck can be read when the container Ck is supported by the supporting section 13U. The transfer device 13B is, for example, a roller conveyer. Also, the supporting section 13U is, for example, a plurality of rollers 13R of the roller conveyer. Alternatively, the transfer device 13B may be a slide folk that can place or hold the container Ck. Also, the supporting section 13U may be a support plate that is arranged instead of the rollers 13R.

(Container Conveying Carriage: Item Supply Device 20)

The item supply device 20 is arranged above the traveling section 11. The item supply device 20 includes chucks 26 that can selectively take out a plurality of items E from the container Cs supported by the supporting section 13T.

A support frame 15 is arranged on the traveling section 11. The support frame 15 movably supports the item supply device 20 in the direction orthogonal to the traveling direction of the carriage 10. The support frame 15 is provided with: four pillars 151 that are uprightly formed at corners surrounding the container transfer device 13A; frameworks 156 and 157 for linking the top ends of the four pillars 151; and a protrusive support frame 155 that protrudes from the frameworks 157 to the direction of the sorting conveyer 45. A guiding rail 152 is supported by the frameworks 156 and the protrusive support frame 155 and extends along the direction orthogonal to the traveling direction of the carriage 10 in a top view. The guiding rail 152 includes: a carriage side portion 152a located above the traveling section 11; and a protrusive portion 152b protruding to the direction of the sorting conveyer 45. The guiding rail 152 is configured to guide the item supply device 20 from a position, which overlaps with the traveling section 11 in the top view, to a position which overlaps with the sorting conveyer 45.

Figure 5:
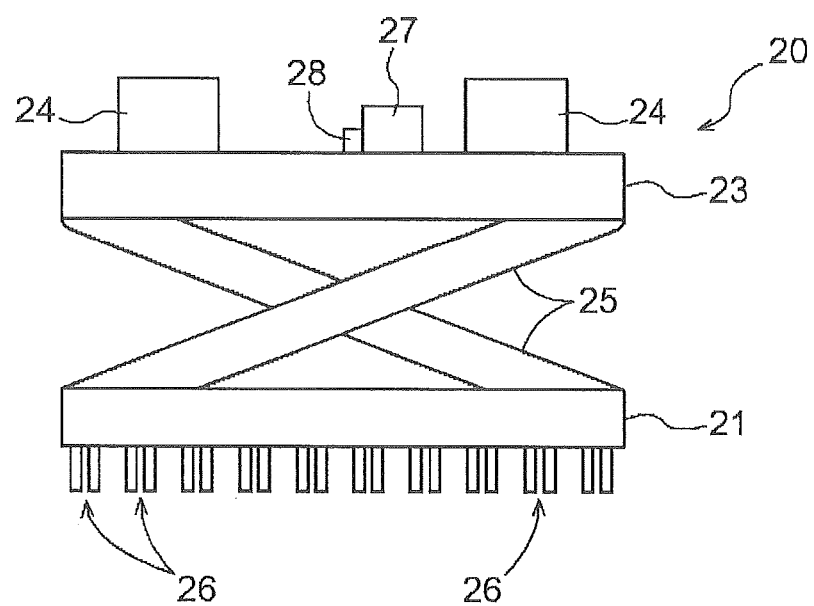
FIG. 5 is a schematic front view showing a configuration of an item supply device in the first embodiment of the present invention.

FIG. 5 is a schematic front view showing the configuration of the item supply device in the first embodiment of the present invention. As shown in FIG. 5, the item supply device 20 includes a guide body 24 that is guided by the guiding rail 152. The guide body 24 is attached to the top portion of a base 23. A lift 25 is fixed to the bottom portion of the base 23. A lift body 21 is fixed to the bottom portion of the lift 25. Through the operation of the lift 25, the lift body 21 is moved upwardly and downwardly with respect to the base 23. A plurality of chucks 26 are arranged at the bottom portion of the lift body 21. Each of the chucks 26 can be independently switched between a hold state in which the single item E is held and a release state in which the hold state is released. Also, an interval between the chucks 26 adjacent to each other is set equal to an interval between the slots Ct adjacent to each other in the container C. Moreover, the total number of the chucks 26 is, for example, a half (for example, 10) of the total number (for example, 20 slots) of the slots Ct included in the container C. Note that the total number of the slots Ct is optional and not limited to the above number. Also, the total number of the chucks 26 can be optionally set within a range in which it is smaller than the total number of the slots Ct included in the container C.

Moreover, the item supply device 20 includes: a driver 27 for moving the item supply device 20 along the guiding rail 152; and an encoder 28 for detecting a movement amount with respect to the guiding rail 152 of the item supply device 20.

The lift 25, the chucks 26, the driver 27 and the encoder 28 operate in response to an instruction from a carriage controller 10K (FIG. 6) to be described later. The driver 27 moves the item supply device 20 to an instructed position on the basis of detection information of the encoder 28. Also, the lift 25 and the chucks 26 execute a lifting operation and a chucking operation in response to instructions from the control unit H, respectively.

(Operation of the Item Supply Device 20)

With reference to FIG. 7, an operation of the item supply device 20 will be described. FIG. 7 is a diagram showing the operation of the item supply device in the first embodiment of the present invention.

Firstly, the carriage controller 10K controls the running driver 16 to stop the carriage 10 at a position corresponding to the sorting conveyer 45. Secondly, the controller 10K controls the driver 27 to move the base 23 to an instructed position (a position instructed by the control unit H) above the container Cs supported by the supporting section 13T. Thirdly, the controller 10K controls the lift 25 to lift down the lift body 21. Fourthly, the controller 10K controls the chucks 26 to switch the chucks 26 corresponding to the items E instructed as taken out targets (the items E instructed by the control unit H) to the hold state and to keep the remaining chucks 26 in the release state. Fifthly, the controller 10K controls the lift 25 to lift up the lift body 21 until the bottom end of the items E arrives at a position higher than the top end of the container Cs. Sixthly, the controller 10K controls the driver 27 to move the base 23 to an instructed position above the container C placed at the container transfer point 45t (the position instructed by the control unit H). Seventhly, the controller 10K controls the lift 25 to lift down the lift body 21. Eighthly, the controller 10K controls the chucks 26 to set all of the chucks 26 to the release state. Through the above procedure, the items E are stored in the container C placed at the container transfer point 45t. Note that each of the instructed positions is a position instructed in correspondence to a position of the slot Ct of the container Cs supported by the supporting section 13T, or the slot Ct of the container C placed at the container transfer point 45t.

The container conveying carriage 10 in this embodiment includes the item supply device 20. Then, the item supply device 20 takes out a plurality of selected items E at the same time, from the container Cs on the carriage 10 (when the number of the selected items is 1, the item supply device 20 takes out this one item), and supplies to the inside of the container C on the sorting conveyer 45.

(Interval between Container Supply Conveyer 41 and Empty Container Supply Conveyer 43C)

With reference to FIG. 1, an interval between the container supply conveyer 41 and the empty container supply conveyer 43C will be described below. In this embodiment, the interval between the container transfer point 41t of the container supply conveyer 41 and the empty container supply conveyer 43C (an interval in the direction along the traveling direction of the carriage 10) is set equal to an interval between the container transfer device 13A and the empty container transfer device 13B in the carriage 10 (an interval along the traveling direction of the carriage). For this reason, a stop position of the carriage 10 (a stop position to receive the container Cs) when the container transfer device 13A receives the container Cs from the container supply conveyer 41 is same as a stop position of the carriage 10 (a stop position to receive the empty container Ck) when the empty container transfer device 13B receives the container Ck from the empty container supply conveyer 43C. That is, at the stop position of the carriage 10, supply of the container Cs to the transfer device 13A and supply of the empty container Ck to the transfer device 13B can be carried out at the same time.

(Sorting Operation by Sorting Conveyer 45)

The sorting conveyer 45 (FIG. 1) is set as a sorting destination in which the items E are sorted for each quality rank. For example, the item E of the rank a is supplied to the sorting conveyer 45A, the item E of the rank b is supplied to the sorting conveyer 45B, the item E of the rank c is supplied to the sorting conveyer 45C, and the item E of the rank n is supplied to the sorting conveyer 45N.

Each of the sorting conveyers 45 supports the container C at the container transfer point 45t. The item E is taken out from the container Cs on the carriage 10 by the item supply device 20, and is supplied to the container C on the container transfer point 45t. The item supply device 20 supplies the item E to the item supply point 45h (the container C on the container transfer point 45t) in a situation that the carriage 10 stops at the stop position corresponding to the sorting conveyer 45.

In this embodiment, all of the plurality of container transfer points 45ta, 45tb, 45tc and 45tn are set at particular transfer points that doubly serve as the plurality of item supply points 45ha, 45hb, 45hc and 45hn, respectively.

As shown in FIG. 7, each of the sorting conveyers 45 includes a plurality of convey rollers that are arrayed in a convey direction. Each of the sorting conveyer 45 includes a plurality of portions that are partitioned in the convey direction so that the container C can be independently moved in the convey direction. Each of the plurality of portions can independently carry out the conveying operation. For this reason, the sorting conveyer 45 can convey the container C, which is located on the downstream side from the transfer point 45t, without conveying the container C located at the container transfer point 45t.

As shown in FIG. 1, a container state detector 46 (for example, an image recognition device that includes a camera or the like) is arranged above the transfer point 45t of the sorting conveyer 45. The detector 46 detects whether or not the container C exists at the transfer point 45t. Also, the detector 46 images the inside of the container C located at the transfer point 45t, if the container C exists. The detector 46 (or, a system connected to the detector) performs image processing on an image obtained by an image pickup operation and determines an accommodation state of the item E in the container C (determines the slot Ct in which the item E is stored): Alternatively, the detector 46 may be a device for sequentially emitting laser lights to, for example, a position corresponding to each slot Ct in the container C on the transfer position 45t and detecting the slot Ct in which the item E is stored, on the basis of the presence or absence of a shielding object (an item E).

(Control Unit H)

The control unit H is configured by a general-purpose computer such as a personal computer and a PC server, which include a central processing unit, and a storage device such as a hard disc.

Figure 6:
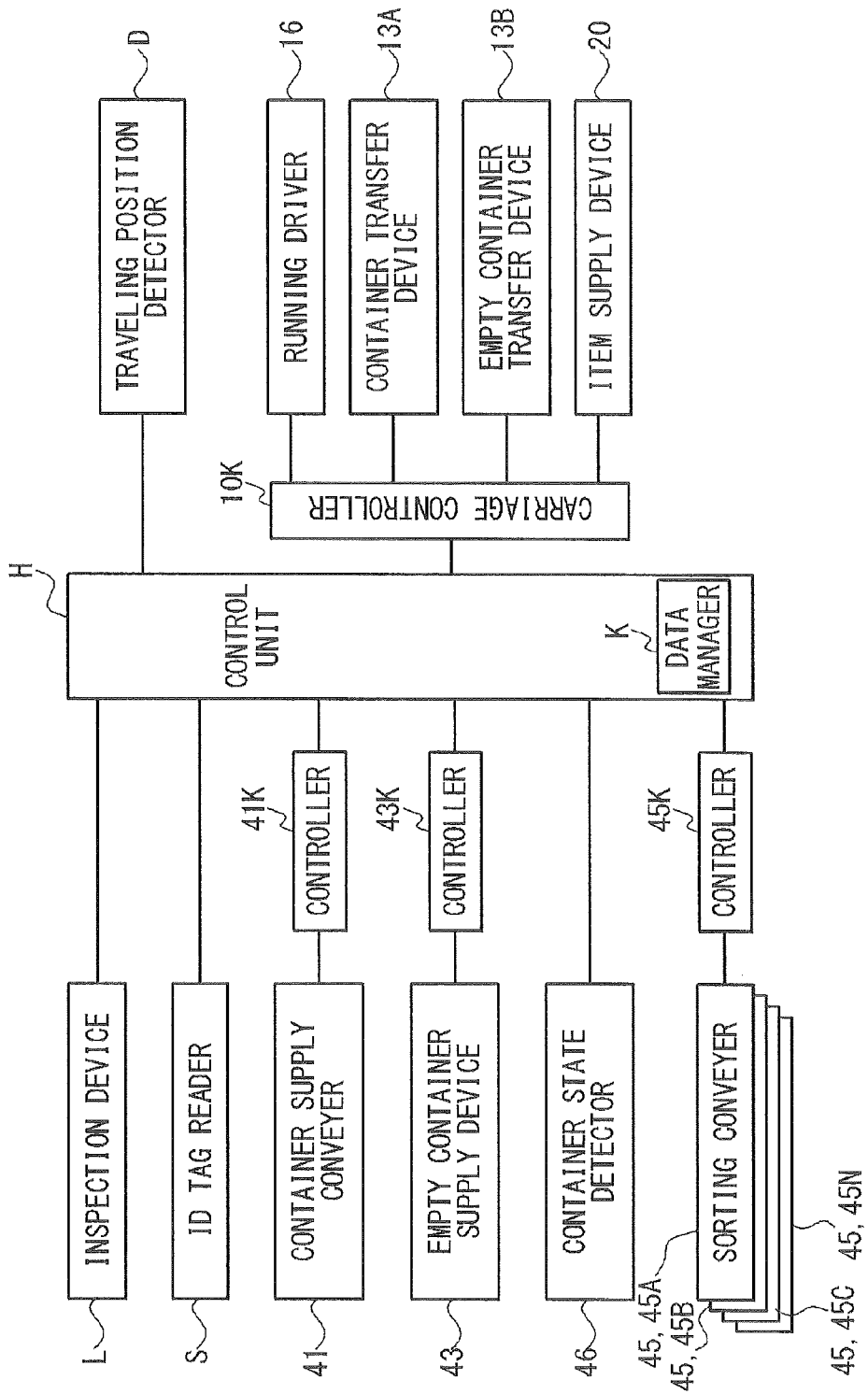
FIG. 6 is a control block diagram in the first embodiment of the present invention.

In the computer that configures the control unit H, a database program is executed. The database relates and stores the ID information of the container Cs, the accommodation position information of the item E (for example, the number of the slot Ct) and the rank information of the item E. The database program corresponds to the data manager K (FIG. 6). That is, the control unit H manages the items E inside the container C on the basis of the rank information of the item E.

Also, as shown in FIG. 6, the inspection device L, the container ID reader S, the container state detector 46 and the traveling position detector D are connected to the control unit H communicably in a wired or wireless manner. The control unit H transmits a control signal to the respective devices and acquires detection information from the respective devices.

Also, a controller 41K for controlling an operation of the container supply conveyer 41, a controller 43K for controlling an operation of the empty container supply device 43; and a controller 45K for controlling respective operations of the plurality of sorting conveyers 45 independently of each other are connected to the control unit H communicably (or in a situation that a power can be supplied) in the wired or wireless manner. The control unit H transmits a control signal for operating each device.

Moreover, the carriage controller 10K is communicably connected to the control unit H in the wired or wireless manner. The carriage controller 10K controls the operations of the running driver 16, the container transfer device 13A, the empty container transfer device 13E and the item supply device 20 in response to an instruction from the control unit H.

The control unit H for controlling the operations of the container transfer device 13A, the empty container transfer device 13B and the item supply device 20 and the traveling operation of the traveling section 11 may be arranged in the container conveying carriage 10. Alternatively, the carriage controller 10K may be arranged in the container conveying carriage 10, and the control unit H may be arranged outside the carriage 10. Alternatively, the carriage controller 10K and the control unit H may be arranged outside the carriage 10.

(Control Executed by Control Unit H)

Figure 8B:
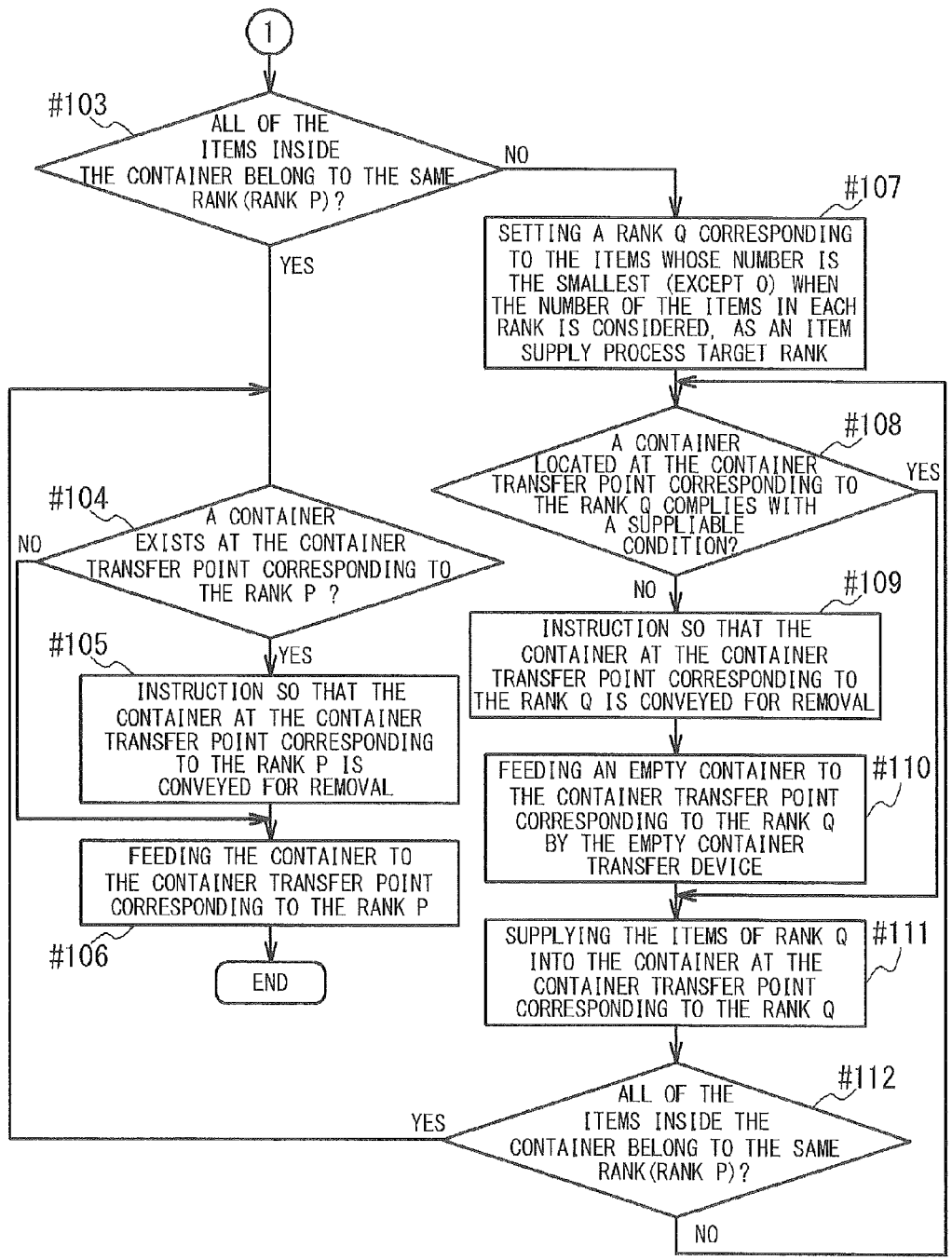
FIG. 8B is a flowchart (second portion) showing a control of the container conveying carriage in the first embodiment of the present invention.

With reference to the flowchart of FIG. 8A and FIG. 8B, the control executed by the control unit H in this embodiment will be described below.

Firstly, the control unit H moves the container conveying carriage 10 to a position (a supplement position for receiving a container Cs) corresponding to the container transfer point 41t in response to an instruction from an upper level management apparatus that is not shown. Secondly, the control unit H operates the container supply conveyer 41 and the container transfer device 13A to move the container Cs to the supporting section 13T of the carriage 10.

When the container Cs is supported by the supporting section 13T, a container ID recorded on the ID tag T is obtained by the ID tag readers (the container ID reader S), and the obtained information is transmitted to the control unit H (Step #101).

The control unit H inquires the database of the data manager K and acquires the quality rank of each item E related to the number of each slot Ct in the container Cs (Step #102).

Next, the control unit H determines whether or not all of the items E inside the container Cs belong to the same rank (tentatively defined as a rank P) (Step #103).

If the control unit H determines that all of the items E inside the container Cs belong to the same rank (Step #103: Yes), the control unit H determines whether or not a container C exists at the container transfer point 45t of the sorting conveyer 45 corresponding to the rank P (for example, the sorting conveyer 45A for the rank a in case of the rank a) on the basis of detection information of the container state detector 46 (Step #104).

If the control unit H determines that the container C exists at the container transfer point 45t (Step #104: Yes), the control unit H issues an instruction to the controller 45K. The controller 45K controls the sorting conveyer 45 in response to the instruction to convey the container C to the downstream side (namely, the container C is removed from the container transfer point 45t) (Step #105).

If the process of the step #105 has been completed, or if the control unit H determines that the container C does not exist at the container transfer point 45t (Step #104: No), the control unit H issues an instruction to the carriage controller 10K. The carriage controller 10K operates the container transfer device 13A in a stop state of the carriage 10 in response to the instruction, to feed the container Cs to the sorting conveyer 45 (Step #106).

Also, at the step #103, if the control unit H determines that all of the items E inside the container Cs do not belong to the same rank (Step #103: No), the control unit H calculates the number of the items E stored in the container Cs for each rank. The control unit H sets a rank (tentatively, defined as a rank Q) corresponding to the items whose number is the smallest (except 0) when the number of the items in each rank is considered as an item supply processing target rank (Step #107).

Next, the control unit H determines whether or not the container C located at the container transfer point 45t of the sorting conveyer 45 corresponding to the rank Q complies with a suppliable condition (Step #108). Here, the suppliable condition is a condition that empty slot(s) Ct that can accommodate the item(s) E held by the chuck 26 exists in the container C.

At the step #108, if the control unit H determines that the container C located at the container transfer point 45t does not comply with the suppliable condition (Step #108: No), the control unit H issues an instruction to the controller 45K. The controller 45K controls the sorting conveyer 45 in response to the instruction to convey the container C located at the container transfer point 45*t* to the downstream side (namely, to remove the container C from the container transfer point 45*t*) (Step #109). After that, the control unit H stops the carriage 10 at a stop position corresponding to the sorting conveyer 45 for the rank Q (the stop position to feed the empty container Ck). Then, the control unit H operates the empty container transfer device 13B in the stop state of the carriage 10 to feed the container Ck to the container transfer point 45*t* of the sorting conveyer 45 corresponding to the rank Q (Step #110).

If the processing of the step #110 has been completed, or if at the step #108, the control unit H determines that the container located at the container transfer point 45*t* complies with the suppliable condition (Step #108: Yes), the control unit H executes an item supply control. That is, the control unit H supplies the item E of the rank Q to the inside of the container C located at the container transfer point 45*t* in the stop state of the carriage 10 at a position corresponding to the sorting conveyer 45 for the rank Q.

Next, the control unit H determines whether or not the number of the kinds of the ranks of the items E that are stored inside the container Cs held by the supporting section 13T becomes one (whether or not all of the items E inside the container Cs belong to the same rank)(Step #112).

At the step #112, if determining that the number of the kinds of the ranks of the items E that are stored inside the container Cs held by the supporting section 13T becomes one, the control unit H proceeds to the step #104. Also, at the step #112, if determining that the number of the kinds of the ranks of the items E that are stored inside the container Cs held by the supporter 13T is not one, the control unit H returns back to the step #108.

That is, the control unit H is configured to selectively execute: an item supply control in which in the stop state of the carriage 10 at the stop position (the stop position to transfer the container) corresponding to the container transfer point 45*t*, the item supply device 20 supplies the item E to the item supply point 45*h* (for example, to the container located at the container transfer point 45*t*); and the container transfer control in which the container transfer device 13A transfers (feeds) the container Cs to the container transfer point 45*t*.

Preferably, the control unit H is configured to execute the container transfer control, if the items E inside the container Cs held by the supporting section 13T have the same attribute, in the stop state of the carriage 10 at the stop position (the stop position to transfer the container Cs) corresponding to the container transfer point 45*t*.

Moreover, in the item supply control, the control unit H may control the operation of the item supply device 20 to preferentially take out items E from the plurality of items E inside the container Cs held by the supporting section 13T, and the items E to be taken out are the same in attribute and the smallest in number over ranks.

Also, in the item supply control, the control unit H may control the item supply device 20, to take out a plurality of items E of the same rank at the same time on the basis of the rank information of the items E stored in the container Cs, and then supply the taken out items E to the container transfer point 45*t* (the item supply point 45*h*).

item supply point 45*h* (for example, to the container located at the container transfer point 45*t*).

Also, the control unit H may execute an empty container supply control for controlling the empty container transfer device 13B to transfer (feed) the empty container Ck to the container transfer point 45*t*. After that, the control unit H controls the item supply device 20 to supply the item E to the container Ck located at the container transfer point 45*t* (the item supply point 45*h*) through the item supply control.

Note that the control unit H controls the operation of the empty container supply device 43 and the empty container transfer device 13B so that the empty container transfer device 13B always holds one empty container Ck as long as possible.

In the above-mentioned embodiment, the container conveying carriage 10 includes the item supply device 20. For this reason, the item E can be directly supplied from the container Cs held in the carriage 10 (held by holding section 13T) to the item supply point 45*h*. Thus, the work efficiency is improved as compared with a case that the item E is supplied from the container Cs to the item supply point 45*h* after the container Cs is unloaded from the carriage 10. Also, since the item supply device 20 is arranged in the container conveying carriage 10, one item supply device 20 can be used to supply the items to the item supply points 45*ha*, 45*hb*, 45*hc* and 45*hn*, respectively.

In the above-mentioned embodiment, the container transfer point 45*t* is a particular transfer point that doubly serves as the item supply point 45*h*. For this reason, when the items E inside the container Cs held in the carriage 10 (held by the holding section 13T) are items E of a single attribute, the container transfer device 13A can be used to supply the items E together with the container Cs to the particular transfer point. Thus, the work for taking out the item E from the container Cs can be omitted, and consequently the item E can be supplied more quickly. Also, it is possible to prevent the occurrence of the container Ck that becomes empty because all of the items E are taken out. Therefore, the container Ck that becomes empty because all of the items E are taken out is not required to be separately conveyed, which improves the work efficiency.

In the above-mentioned embodiment, the control unit H manages the rank information (attribute information) of the items E inside the container Cs. For this reason, the item supply device 20 can sort the items E into each of the item supply points 45*ha*, 45*hb*, 45*hc* and 45*hn* for each attribute.

In the above-mentioned embodiment, in the item supply control, the control unit H controls the item supply device 20 to preferentially take out the items E, which are same in attribute and the smallest in number over ranks, from the plurality of items E inside the container Cs held by the supporting section 13T. For this reason, the number of the operations of the item supply device 20 can be minimized, and consequently the work can be carried out more quickly.

In the above-mentioned embodiment, in the item supply control, the control unit H controls the item supply device 20 to take out the plurality of items E of the same rank at the same time on the basis of the rank information of the items E stored in the container Cs, and then supply the taken out items to the item supply point 45*h* (for example, to the container located at the container transfer point 45*t*). For this reason, as compared with a case that the items E are taken out and supplied one by one, it is possible to reduce the time necessary for the supplying work.

In the above-mentioned embodiment, the container conveying carriage 10 can hold the empty container Ck in addition to the container Cs. For this reason, even if the empty container Ck is required to be supplied to the container transfer point 45*t*, it is possible to reduce a traveling operation time of the container conveying carriage 10 required to supply the container Ck.

Note that the above effects are the effects that can be provided arbitrarily and additionally, in the above-mentioned embodiment. Thus, in the above-mentioned embodiment, the provision of the above effects should not be construed to be essential.

(Another Embodiment)

(1) The above-mentioned embodiment indicates an example applied to the conveying system 1 (sorting facility 1) for sorting the items E for each quality rank. However, as the attribute information, information other than the quality rank (for example, information such as a manufacture lot number, a manufacture date, or a weight) may be used. That is, an information type to which the attribute information should be set is optional. Also, as the conveying system 1 (sorting facility 1), it is not limited to a system for sorting the cell E (secondary battery E). For example, it may be applied to a system for sorting a semiconductor substrate (wafer), an FPD glass substrate or the like.

(2) The above-mentioned embodiment exemplifies the configuration in which the container state detector 46 detects whether or not the container C exists at the container transfer point 45t of the sorting conveyer 45. Also, the above-mentioned embodiment exemplifies the configuration for detecting the accommodation state of the item E inside the container C located at the container transfer point 45t (detecting the slot Ct in which the item E is stored), if the container C exists at the container transfer point 45t. However, the above-mentioned embodiment is not limited to the above configuration. For example, it is allowable to employ a configuration in which, whether or not the container C exists at the container transfer point 45t of the sorting conveyer 45 is detected by a load sensor. Also, with regard to the accommodation state of the item E inside the container C, it is allowable to employ a configuration for detecting the accommodation state of the item E on the basis of position information of the item E transmitted to (stored in) the control unit H. Here, the position information of the item E, which is moved from the container Cs supported by the container transfer device 13A to the container C placed at the container transfer point 45t, is transmitted to (stored in) the control unit H.

(3) The above-mentioned embodiment is configured such that in a stop state of the carriage 10 at the stop position corresponding to the sorting conveyer 45, the item supply processing is executed by the item supply device 20. However, the above-mentioned embodiment is not limited to the above configuration. For example, in a state that the traveling operation of the carriage 10 is continued, the item supply process may be executed by the item supply device 20.

(4) The above-mentioned embodiment describes the configuration in which the four sorting conveyers 45 are arranged as the particular transfer points (the container transfer points 45t). However, the above-mentioned embodiment is not limited to the above configuration. For example, it is allowable to employ a configuration in which the number of arranged sorting conveyers 45 is three or less, or five or more. Also, the above-mentioned embodiment indicates an example in which all of the plurality of container transfer points 45ta, 45tb 45tc and 45tn are defined as the particular transfer points. However, it is possible that some of container transfer points 45t may not be particular transfer points. Also, the above-mentioned embodiment describes the configuration in which the sorting conveyer 45 (the container transfer point 45t) as the particular transfer point is arranged on only one side in the lateral direction to the traveling path of the container conveying carriage 10. However, the sorting conveyer 45 may be arranged to be divided into the left and right sides (both sides) in the lateral direction to the traveling path of the container conveying carriage 10. In this case, preferably, the protrusive portion 152b of the guiding rail 152 is arranged to protrude into both of the lateral directions of the traveling path of the carriage 10. Also, preferably, the item supply device 20 is movably configured in the lateral direction to the traveling path of the carriage 10 between at the position that overlap with the left sorting conveyer 45 and at the position that overlap with the right sorting conveyer 45.

(5) The above-mentioned embodiment indicates the configuration in which the container transfer device 13A and the empty container transfer device 13B are arranged above the traveling section 11 in a state that the transfer devices 13A and 13B are arrayed in the traveling direction. However, the above-mentioned embodiment is not limited to the above configuration. For example, it is allowable to employ a configuration in which the container transfer device 13A and the empty container transfer device 13B are arranged to be arrayed in the upper/lower direction.

(6) The above-mentioned embodiment indicates the configuration in which in the container conveying carriage 10, the quality rank is used as the attribute information, and the items E are sorted on the basis of the quality rank. However, the above-mentioned embodiment is not limited to the above configuration. For example, it is allowable to employ a configuration in which without carrying out the sorting operation based on the attribute information such as the quality rank, the items of the same attribute are sequentially distributed to a plurality of sorting destinations.

(7) The above-mentioned embodiment exemplifies the configuration that preferentially takes out the items E, which are same in attribute and the smallest in number while being checked for each rank, from the plurality of items E in the container Cs located at the holding section 13T, in the item supply control. However, the above-mentioned embodiment is not limited to the above configuration. For example, in the item supply control, it is allowable to preferably take out the items E of the attribute in which the number of times necessary for the taking out operations by the item supply device 20 is small. That is, when the items E are moved while being held in the chucks 26, even in the items E which are same in attribute and small in number, the number of times of the taking out operations by the item supply device 20 is small, in case that the items E are close to each other in the array direction in the container Cs. On the contrary, in case that the items E are distributedly stored in the slots Ct separated in the array direction in the container Cs, there is a fear that the number of times of the taking out operations by the item supply device 20 is large. For this reason, it is allowable to carry out a control for counting the number of times required for the item supply device 20 to take out the items E stored in the container Cs and preferentially taking out the items E in an order starting with the small count number. With this control, it is possible to reduce the time required to execute the item supply control as short as possible.

(8) The above-mentioned embodiment is configured such that the container C can store the plurality of items E. However, the above-mentioned embodiment is not limited to the above configuration. For example, the container C may be designed to accommodate only one item E. Also, the container C that can store the plurality of items E and the container C that can store only one item E are mixed.

(9) The above-mentioned embodiment exemplifies the configuration in which the item supply device 20 includes a plurality of taking out devices (such as the chucks 26). Also, the above-mentioned embodiment exemplifies the configuration in which the item supply device 20 takes out the plurality of items E (cells E) at the same time. However, the above-mentioned embodiment is not limited to the above configuration. The item supply device 20 may be configured to include one taking out device (for example, chuck 26). Also, the item supply device 20 may be configured to take out only one item E at the same time. In case that the item supply device 20 is configured to take out only one item E at the same time, the items E are supplied to the container C supported at the container transfer point 45t while being filled so as to avoid emptiness from being generated in the slot Ct. Note that in the case of the above configuration, the control unit H may store a position of a slot Ct where the item E is supplied at the last time and control the item supply device 20 to supply the item E to a slot Ct adjacent to the slot Ct where the item E is supplied at the last time when the item E is supplied at the next time. Also, the above-mentioned embodiment exemplifies an example in which the taking out device for taking out the item E is configured as the chuck 26 for holding the item E in the state that the item E is sandwiched. However, if the item E can be held, various configurations (for example, vacuum chuck) can be employed.

(10) The above-mentioned embodiment exemplifies the configuration in which the plurality of chucks 26 of the item supply device 20 is non-movably arranged in the lift body 21. However, the above-mentioned embodiment is not limited to the above configuration. For example, it is allowable to employ a configuration in which the respective chucks 26 are arranged in the lift body 21 slidably in a horizontal direction. According to the above configuration, even if the positions of the plurality of items taken out from the container Cs that is held by the supporting section 13T and the positions of the empty slots Ct of the container C on the container transfer point 45t do not correspond to each other, it is possible to flexibly supply the items E in correspondence to the positions of the empty slots Ct, by adjusting the horizontal positions of the items held by the respective chucks 26.

(11) The above-mentioned embodiment exemplifies the configuration in which the traveling path (rail R) is the linear route inside a horizontal plane, the container supply conveyer 41 is a linear conveyer inside a horizontal plane, and the sorting conveyer 45 is a linear conveyer inside a horizontal plane. However, the above-mentioned embodiment is not limited to the above configuration. For example, the traveling path and the respective conveyers may be curved. Also, the traveling path may be an inclined path or a vertical path. Moreover, the respective conveyers may be inclined conveyers or vertical conveyers.

(12) The above-mentioned embodiment exemplifies the configuration in which the conveying system 1 is a conveying system arranged on a floor surface. However, the above-mentioned embodiment is not limited to the above configuration. For example, the conveying system 1 may be a conveying system arranged on a ceiling. Also, the conveying system 1 may be such that a part thereof is arranged on the floor surface, and a part thereof is arranged on the ceiling.

(13) The above-mentioned embodiment exemplifies the configuration in which the container transfer device 13A of the container conveying carriage 10 transfers the container C in the direction orthogonal to the traveling direction of the carriage 10. However, the above-mentioned embodiment is not limited to the above configuration. For example, the container transfer device 13A of the carriage 10 may transfer the container C in a direction parallel to the traveling direction of the carriage 10.

(14) The above-mentioned embodiment exemplifies the configuration in which the item supply device 20 of the container conveying carriage 10 supplies the item E in the direction orthogonal to the traveling direction of the carriage 10. However, the above-mentioned embodiment is not limited to the above configuration. For example, the item supply device 20 of the carriage 10 may supply the item E in the direction parallel to the traveling direction of the carriage 10.

As mentioned above, the present invention has been described by referring to the embodiments. However, the present invention is not limited to the above-mentioned embodiments. Various modifications can be performed on the above-mentioned embodiments. For example, any combination within a range compatible to each other with regard to the above-mentioned embodiments may be regarded as the embodiment of the present invention.

What is claimed is:

1. A container conveying carriage comprising:
   a traveling section which is movable along a traveling path;
   a supporting section disposed to support a container;
   a container transfer device disposed to transfer said container;
   an item supply device disposed to supply an item stored in said container; and
   a control unit disposed to control a container transfer operation of said container transfer device, an item supply operation of said item supply device, and a traveling operation of said traveling section,
   wherein said container transfer device is configured to transfer said container between said supporting section and a container transfer point outside said carriage, and
   wherein said item supply device is configured to take out the stored item from said container and supplies the taken out item from said container to an item supply point outside said carriage,
   wherein the container transfer operation is an operation in which said container transfer device transfers said container from said supporting section to said container transfer point,
   wherein the item supply operation is an operation in which said item supply device takes out the stored item from said container and supplies the taken out item to an item supply point; and
   wherein said control unit is configured to selectively instruct to execute said container transfer operation and said item supply operation in a stop state of said traveling section at a stop position corresponding to said container transfer point.

2. The container conveying carriage according to claim 1, further comprising:
   an empty container transfer device other than said container transfer device disposed to transfer an empty container to the container transfer point,
   wherein said control unit is configured to instruct to execute an empty container transfer operation in which said empty container transfer device transfers said empty container to the container transfer point, and
   wherein said control unit is configured to instruct to execute the item supply operation in which said item supply device takes out the stored item from said container and supplies the taken out item into said empty container located at said container transfer point after the empty container transfer operation.

3. A conveying system comprising:
   a plurality of container transfer points;
   a traveling path arranged along said container transfer points;

an item supply point arranged adjacent to said traveling path;
a container conveying carriage; and
a control unit,
wherein said container conveying carriage comprises:
a traveling section which is movable along said traveling path;
a supporting section disposed to support a container;
a container transfer device disposed to transfer said container; and
an item supply device disposed to supply an item stored in said container,
wherein said container transfer device is configured to transfer said container between said supporting section and one of said container transfer points,
wherein said item supply device is configured to take out the stored item from said container and supplies the taken out item to said item supply point,
wherein the control unit is disposed to control a container transfer operation of said container transfer device, an item supply operation of said item supply device, and a traveling operation of said traveling section,
wherein at least one of said container transfer points is a particular transfer point which doubly serves as said item supply point,
wherein the container transfer operation is an operation in which said container transfer device transfers said container from said supporting section to said particular transfer point,
wherein the item supply operation is an operation in which said item supply device takes out the stored item from said container and supplies the taken out item to said particular transfer point, and
wherein said control unit is configured to selectively instruct to execute the container transfer operation and the item supply operation in a stop state of said traveling section at a stop position corresponding to said particular transfer point.

4. The conveying system according to claim 3, wherein said container stores a plurality of said items;
wherein said control unit is configured to manage information of said plurality of items inside said container based on attribute information of said plurality of items; and
wherein said control unit is configured to instruct to execute the container transfer operation in the stop state of said traveling section at the stop position corresponding to said particular transfer point, when all of said plurality of items inside said container have a single attribute.

5. The conveying system according to claim 3, wherein said container conveying carriage further comprises:
an empty container transfer device, other than said container transfer device, disposed to transfer an empty container to said particular transfer point,
wherein said control unit is configured to instruct to execute an empty container transfer operation in which said empty container transfer device transfers said empty container to said particular transfer point, and
wherein said control unit is configured to instruct to execute the item supply operation in which said item supply device takes out the stored item from said container and supplies the taken out item to said empty container located at said particular transfer point after said empty container transfer operation.

6. A conveying system comprising:
a plurality of container transfer points;
a traveling path arranged along said container transfer points;
an item supply point arranged adjacent to said traveling path;
a container conveying carriage; and
a control unit,
wherein said container conveying carriage comprises:
a traveling section which is movable along said traveling path;
a supporting section disposed to support a container;
a container transfer device disposed to transfer said container; and
an item supply device disposed to supply an item stored in said container,
wherein said container transfer device is configured to transfer said container between said supporting section and one of said container transfer points,
wherein said item supply device is configured to take out the stored item from said container and supplies the taken out item to said item supply point,
wherein the control unit is disposed to control a container transfer operation of said container transfer device, an item supply operation of said item supply device, and a traveling operation of said traveling section,
wherein said container stores a plurality of said items; and
wherein said control unit is configured to instruct said item supply device to preferentially take out ones of said plurality of items from said container, the ones of said plurality of items being same in attribute and a number of the ones of said plurality of items being the smallest over attributes, and to supply said taken out items to said item supply point.

7. A conveying system comprising:
a plurality of container transfer points;
a traveling path arranged along said container transfer points;
an item supply point arranged adjacent to said traveling path;
a container conveying carriage; and
a control unit,
wherein said container conveying carriage comprises:
a traveling section which is movable along said traveling path;
a supporting section disposed to support a container;
a container transfer device disposed to transfer said container; and
an item supply device disposed to supply an item stored in said container,
wherein said container transfer device is configured to transfer said container between said supporting section and one of said container transfer points,
wherein said item supply device is configured to take out the stored item from said container and supplies the taken out item to said item supply point,
wherein the control unit is disposed to control a container transfer operation of said container transfer device, an item supply operation of said item supply device, and a traveling operation of said traveling section,
wherein said container is configured to store a plurality of said items,
wherein said item supply device is capable of taking out selected items from said container at a same time, and
wherein said control unit is configured to instruct said item supply device to take out the selected items of a same attribute at the same time and supply the taken out items to said item supply point.

* * * * *